United States Patent
Cok

(10) Patent No.: US 9,345,144 B2
(45) Date of Patent: May 17, 2016

(54) MAKING MULTI-LAYER MICRO-WIRE STRUCTURE

(71) Applicant: Eastman Kodak Company, Rochester, NY (US)

(72) Inventor: Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 383 days.

(21) Appl. No.: 13/863,615

(22) Filed: Apr. 16, 2013

(65) Prior Publication Data

US 2014/0306382 A1  Oct. 16, 2014

(51) Int. Cl.
*H05K 1/09* (2006.01)
*H05K 3/40* (2006.01)
*H01L 21/288* (2006.01)
*H05K 3/12* (2006.01)
*G06F 3/044* (2006.01)

(52) U.S. Cl.
CPC .............. *H05K 3/1258* (2013.01); *G06F 3/044* (2013.01); *H01L 21/288* (2013.01); *H05K 1/092* (2013.01); *H05K 3/4053* (2013.01); *G06F 2203/04103* (2013.01); *H05K 2201/0338* (2013.01); *H05K 2201/09981* (2013.01); *H05K 2203/0108* (2013.01); *H05K 2203/0139* (2013.01); *H05K 2203/1476* (2013.01); *H05K 2203/1581* (2013.01)

(58) Field of Classification Search
None
See application file for complete search history.

(56) References Cited

U.S. PATENT DOCUMENTS

| | | | |
|---|---|---|---|
| 6,425,294 B1 * | 7/2002 | Shiono et al. | 73/756 |
| 8,179,381 B2 | 5/2012 | Frey et al. | |
| 8,269,404 B2 | 9/2012 | Cho et al. | |
| 2004/0213962 A1 * | 10/2004 | Bourdelais et al. | 428/172 |
| 2005/0133823 A1 * | 6/2005 | Mori et al. | 257/200 |
| 2007/0216274 A1 * | 9/2007 | Schultz et al. | 313/46 |
| 2008/0191288 A1 * | 8/2008 | Kwon et al. | 257/383 |
| 2008/0257211 A1 | 10/2008 | Oriakhi | |
| 2010/0328248 A1 | 12/2010 | Mozdzyn | |
| 2011/0303885 A1 | 12/2011 | Vanheusden et al. | |

FOREIGN PATENT DOCUMENTS

CN 102063951 5/2011

* cited by examiner

*Primary Examiner* — Nadine Norton
*Assistant Examiner* — Bradford Gates
(74) *Attorney, Agent, or Firm* — Raymond L. Owens; William R. Zimmerli

(57) ABSTRACT

A method of making a multi-layer micro-wire structure includes providing a substrate with a plurality of micro-channels. First and second material compositions are provided. The first material composition is coated over the substrate and micro-channels and then removed from the substrate surface but not the micro-channels. The second material composition is coated over the substrate, in the micro-channels, and over the first materials, and then removed from the substrate surface but not the micro-channels. The first and second material compositions are cured in the micro-channels in a common step to form a cured first material layer and a cured second material layer in the micro-channels. The cured first material layer and the cured second material layer form an electrically conductive multi-layer micro-wire in each micro-channel.

15 Claims, 27 Drawing Sheets

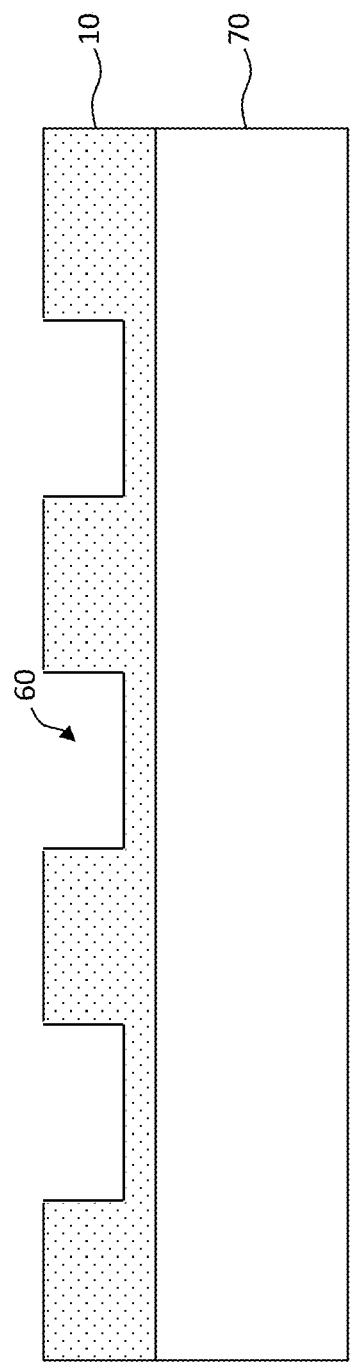

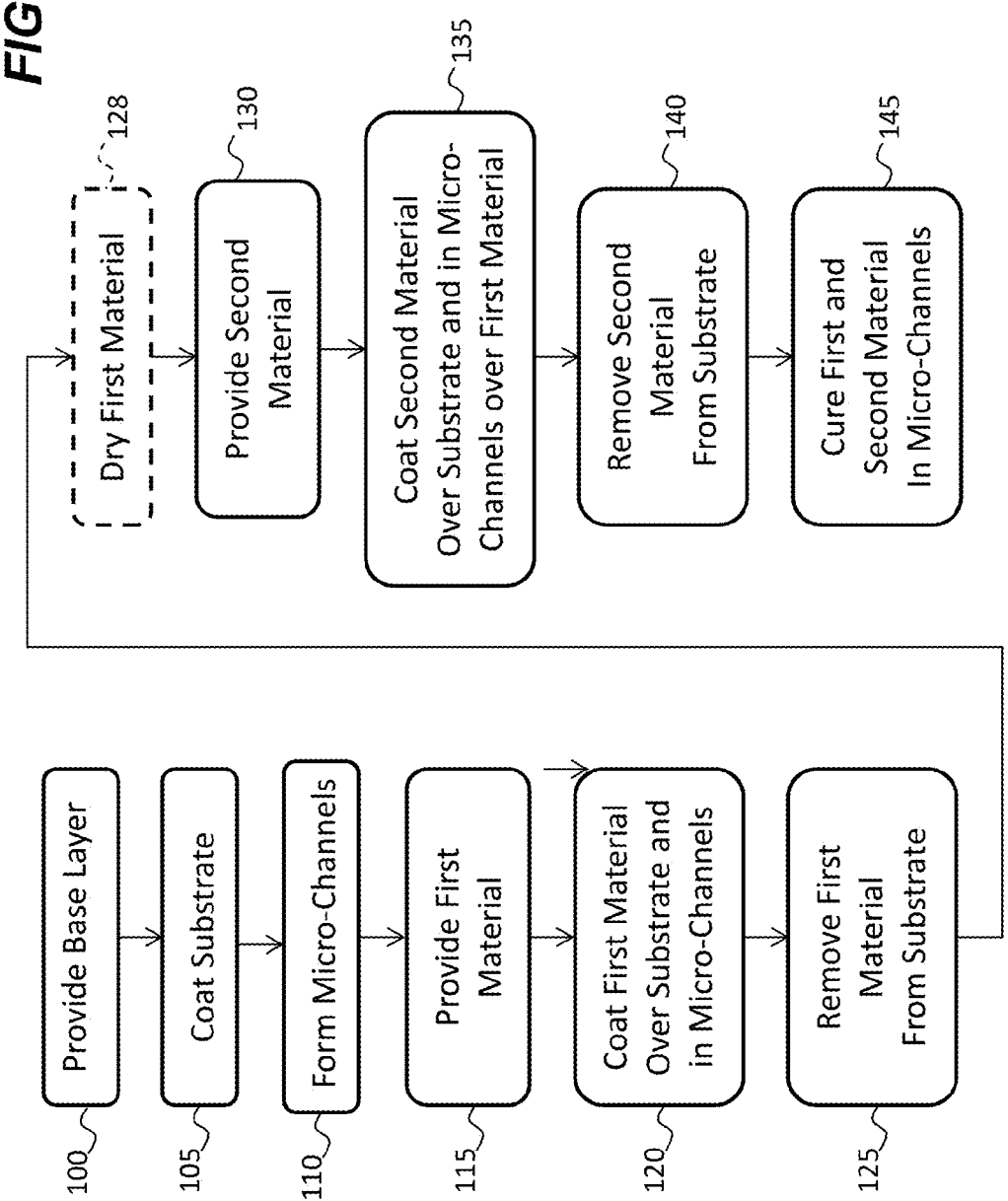

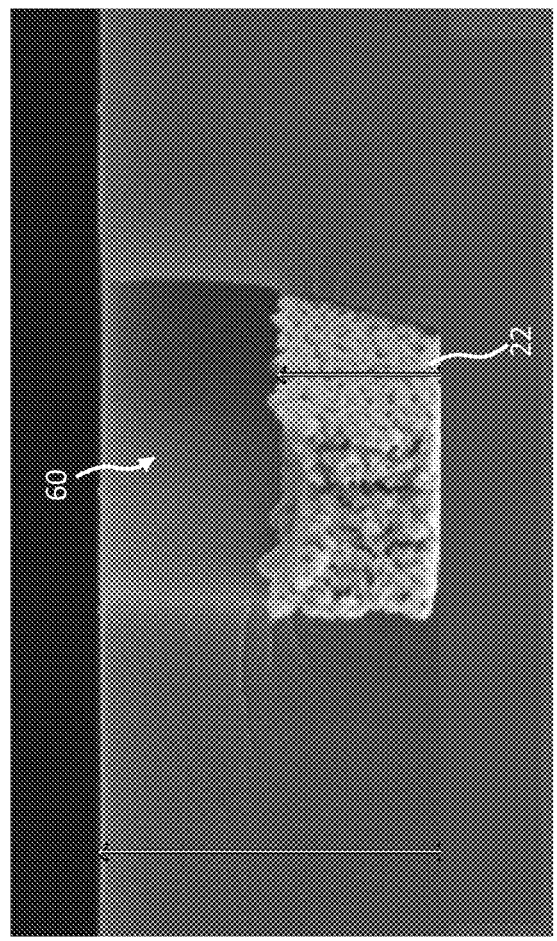

MAKING MULTI-LAYER MICRO-WIRE STRUCTURE

CROSS REFERENCE TO RELATED APPLICATION

Reference is made to commonly-assigned U.S. patent application Ser. No. 13/779,939 filed Feb. 28, 2013, entitled "Making Multi-Layer Micro-Wire Structure" by Yau et al, the disclosure of which is incorporated herein.

FIELD OF THE INVENTION

The present invention relates to micro-wire electrical conductors formed in an embossed substrate.

BACKGROUND OF THE INVENTION

Transparent conductors are widely used in the flat-panel display industry to form electrodes for electrically switching the light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Conventional transparent conductors are typically coated on a substrate to form a patterned layer of a transparent, conductive material, such as indium tin oxide or other metal oxide. Such materials are increasingly expensive and relatively costly to deposit and pattern. Moreover, metal oxides have a limited conductivity and transparency, and tend to crack when formed on flexible substrates.

More recently, transparent electrodes including very fine patterns of conductive micro-wires have been proposed. For example, capacitive touch-screens with mesh electrodes including very fine patterns of conductive elements, such as metal wires or conductive traces, are taught in U.S. Patent Application Publication No. 2010/0328248 and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. The transparent micro-wire electrodes include micro-wires between 0.5μ and 4μ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels can be formed in a substrate using an embossing technique. Embossing methods are generally known in the prior art and typically include coating a curable liquid, such as a polymer, onto a rigid substrate. The polymer is partially cured (through heat or exposure to light or ultraviolet radiation) and then a pattern of micro-channels is embossed (impressed) onto the partially cured polymer layer by a master having a reverse pattern of ridges formed on its surface. The polymer is then completely cured. A conductive ink is subsequently coated over the substrate and into the micro-channels, the excess conductive ink between micro-channels 60 is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (photosensitive resist) is removed, followed by electro-deposition of metallic ions in a bath.

In some applications, it is desirable for conductive elements such as metal wires or conductive traces to appear black. U.S. Patent Application Publication No. 2008/0257211 discloses a variety of metallic colored inks and its contents are hereby incorporated by reference.

Optical attributes such as transparency, contrast, or reduced reflectivity are important for display systems. Mechanical concerns such as flexibility and environmental robustness such as scratch and chemical resistance are also important, especially for touch screens designed for interaction with humans. There is a need, therefore, for improved micro-wire structures that meet these needs.

SUMMARY OF THE INVENTION

In accordance with the present invention, a method of making a multi-layer micro-wire structure comprises:
  providing a substrate having a surface;
  forming a plurality of micro-channels in the substrate;
  providing a first material composition and providing a second material composition different from the first material composition;
  coating the first material composition over the substrate surface and in the micro-channels;
  removing the first material composition from the substrate surface and not from the micro-channels;
  coating the second material composition over the substrate surface, in the micro-channels, and over the first material composition in the micro-channels;
  removing the second material composition from the substrate surface and not from the micro-channels;
  curing the first and second material compositions in the micro-channels in a common step to form a cured first material layer and a cured second material layer in the micro-channels; and
  wherein the cured first material layer and the cured second material layer form an electrically conductive multi-layer micro-wire in each micro-channel.

The present invention provides an electrically conductive micro-wire structure having improved transparency, contrast, reduced reflectivity, improved flexibility, and resistance to scratches.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 3A-3G are sequential cross sections illustrating steps in the construction of an embossed substrate useful in an embodiment of the present invention;

FIGS. 5-6 are flow diagrams illustrating embodiments of the present invention;

FIG. 12 is a micro-graphic image in cross section of a structure useful in an embodiment of the present invention.

Figure 1:
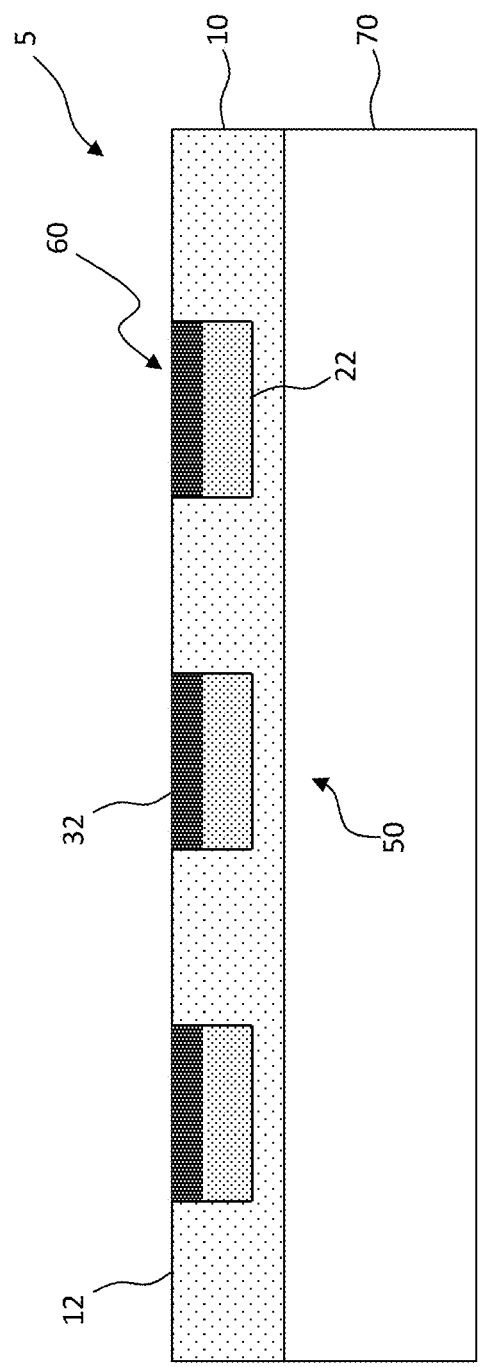
FIG. 1 is a cross section of an embodiment of the present invention.

The Figures are not necessarily to scale, since the range of dimensions in the drawings is too great to permit depiction to scale.

DETAILED DESCRIPTION OF THE INVENTION

The present invention is directed toward multi-layer micro-wire structures formed in a substrate that are capable of conducting electrical currents. The electrically conductive micro-wire structures provide reduced reflectivity and can improve flexibility or resistance to scratches.

Referring to FIG. 1 in an embodiment of the present invention, a multi-layer micro-wire structure 5 includes a substrate 10 having a substrate surface 12. In an embodiment, substrate 10 is formed on a base layer 70. Base layer 70 forms a support for substrate 10. Alternatively, base layer 70 can be considered a separate substrate or a portion of substrate 10. Substrate 10 can be a multi-layer substrate and can incorporate underlying layers such as base layer 70.

A plurality of separated micro-channels 60 are formed in substrate 10. Micro-channels 60 extend from substrate surface 12 toward base layer 70. A first material layer 22 is located in each micro-channel 60 and not on substrate surface 12 between micro-channels 60. A second material layer 32 different from first material layer 22 is located in each micro-channel 60 and not on substrate surface 12 and not between micro-channels 60. First and second material layers 22, 32 are located in micro-channels 60 only and are not located on substrate surface 12 between micro-channels 60. First material layer 22 and second material layer 32 form an electrically conductive multi-layer micro-wire 50 in each micro-channel 60. In an embodiment, one or more materials in first material layer 22 are different from one or more materials in second material layer 32. In a further embodiment, one or more materials in first material layer 22 are also present in second material layer 32.

The designation of first or second with respect to material compositions or layers is arbitrary and does not necessarily specify order, structure, or arrangement. Thus, depending on the embodiment of the present invention, first material layer 22 is formed on second material layer 32 or second material layer 32 is formed on first material layer 22. In any specific example or embodiment, first or second material layer designations 22, 32 can be reversed without changing the nature of the invention.

According to various embodiments of the present invention, substrate 10 is any material having substrate surface 12 in which micro-channels 60 can be formed. Base layer 70 can be any material capable of supporting substrate 10. For example, glass and plastic are suitable materials known in the art for base layers 70 on which substrate 10 is provided having micro-channels 60. In various embodiments, base layer 70 or substrate 10 is rigid, flexible, or transparent. Substrate 10 of the present invention is large enough for a user to directly interact therewith, for example with an implement such as a stylus or with a finger or hand. The substrates of integrated circuits are too small for such interaction.

Micro-channel 60 is a groove, trench, or channel formed in substrate 10 and extends from substrate surface 12 into substrate 10 toward base layer 70. Micro-channel 60 can have a cross-sectional width in a direction parallel to substrate surface 12 less than 20 microns, for example 10 microns, 5 microns, 4 microns, 3 microns, 2 microns, 1 micron, or 0.5 microns, or less. In an embodiment, the cross-sectional depth of micro-channel 60 is comparable to the cross-sectional width. Micro-channels 60 can have a rectangular cross section, as shown. Other cross-sectional shapes, for example trapezoids, are known and are included in the present invention. First and second material layers 22, 32 can have different depths, for example first material layer 22 has a depth greater than the depth of second material layer 32, or vice versa. As used herein, the depth of a material layer (such as first or second material layers 22, 32) or the depth of a multi-layer micro-wire 50 is also the thickness of the layer or micro-wire. The width or depth of a layer is measured in cross section. Micro-channels 60 can be deeper than they are wide.

According to various embodiments of the present invention, first and second material layers 22, 32 of multi-layer micro-wires 50 have different electrical, mechanical, optical, or chemical properties. At least one of first or second material layers 22, 32 of multi-layer micro-wire 50 is electrically conductive. In an embodiment, more than one material layer of multi-layer micro-wires 50 is electrically conductive, for example first and second material layers 22, 32 are electrically conductive. In different embodiments, first material layer 22 is more electrically conductive than second material layer 32 or second material layer 32 is more electrically conductive than first material layer 22. Alternatively, only first or second material layer 22, 32 is electrically conductive. First or second material layers 22, 32 can have different optical properties. In an embodiment, second material layer 32 is more light-absorbing than first material layer 22 or first material layer 22 is more light-absorbing than second material layer 32.

In various embodiments, first material layer 22 or second material layer 32 fills micro-channel 60 and extends to substrate surface 12 (as shown in FIG. 1). Alternatively, first material layer 22 or second material layer 32 does not fill micro-channel 60 and extends beneath substrate surface 12 (not shown).

Figure 2:
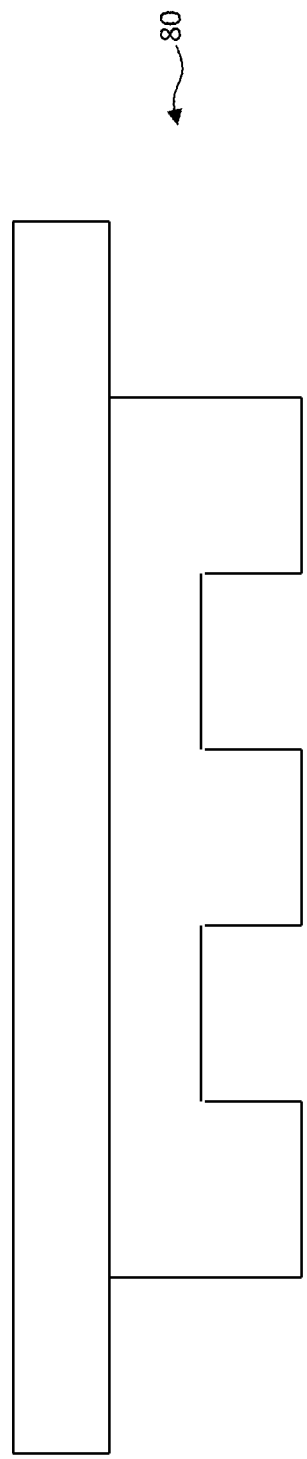
FIG. 2 is a cross section of an embossing stamp useful with the present invention.
Figure 3A:
Figure 3B:
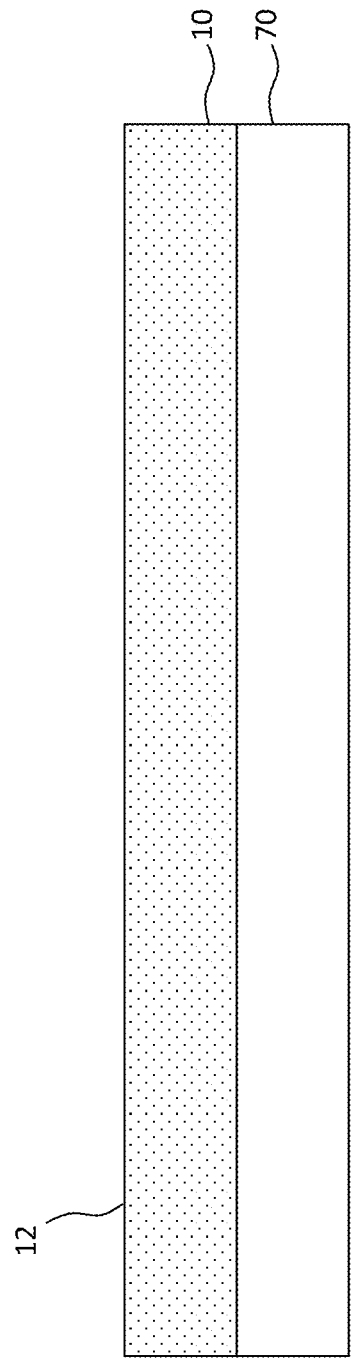
Figure 3C:
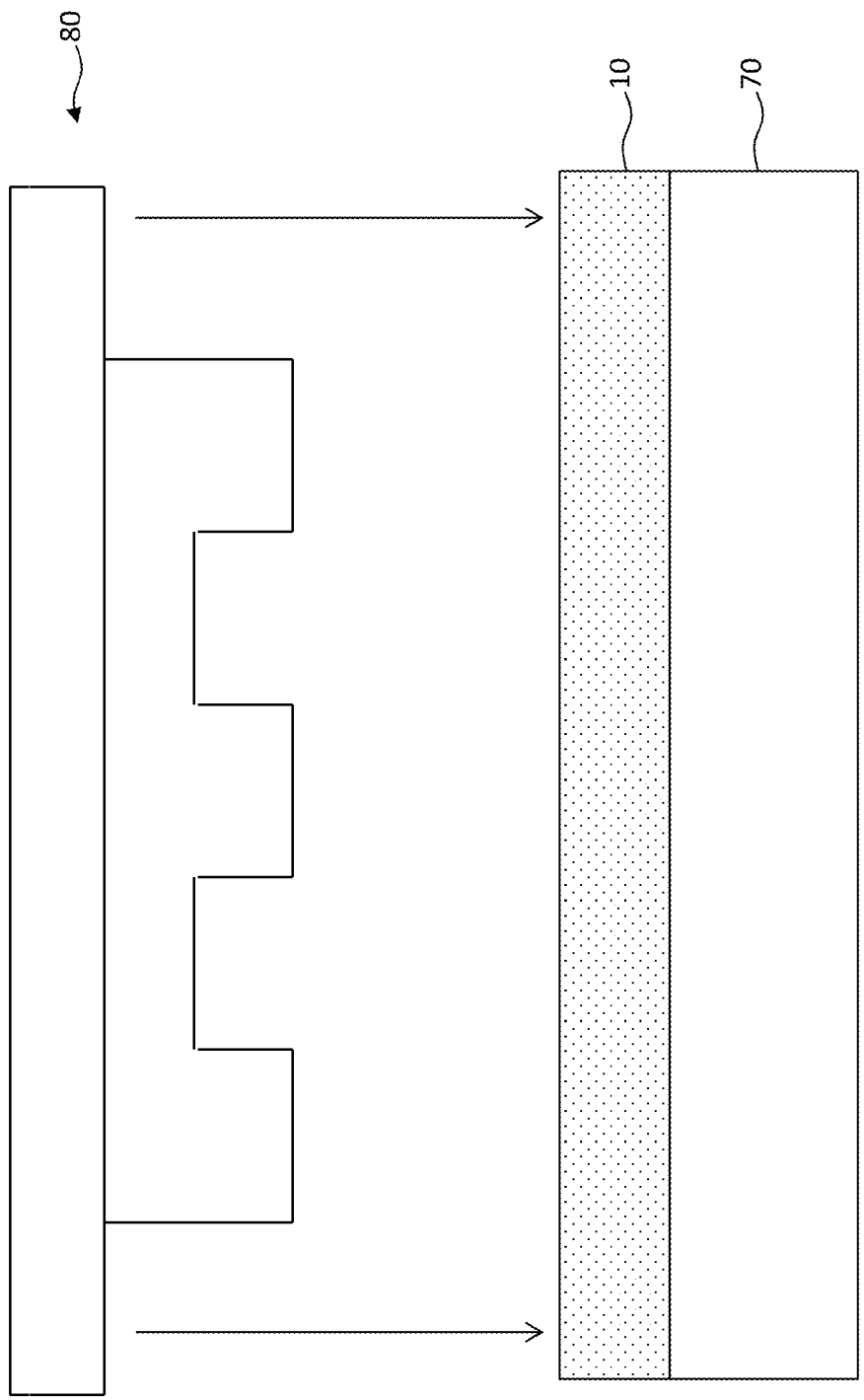
Figure 3D:
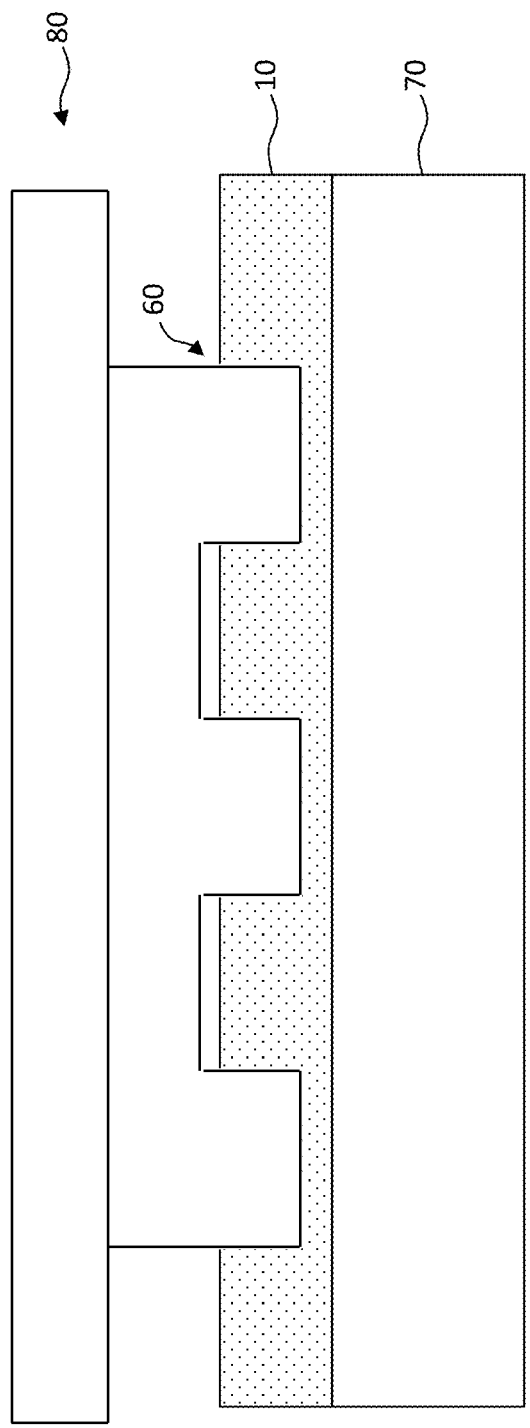
Figure 3E:
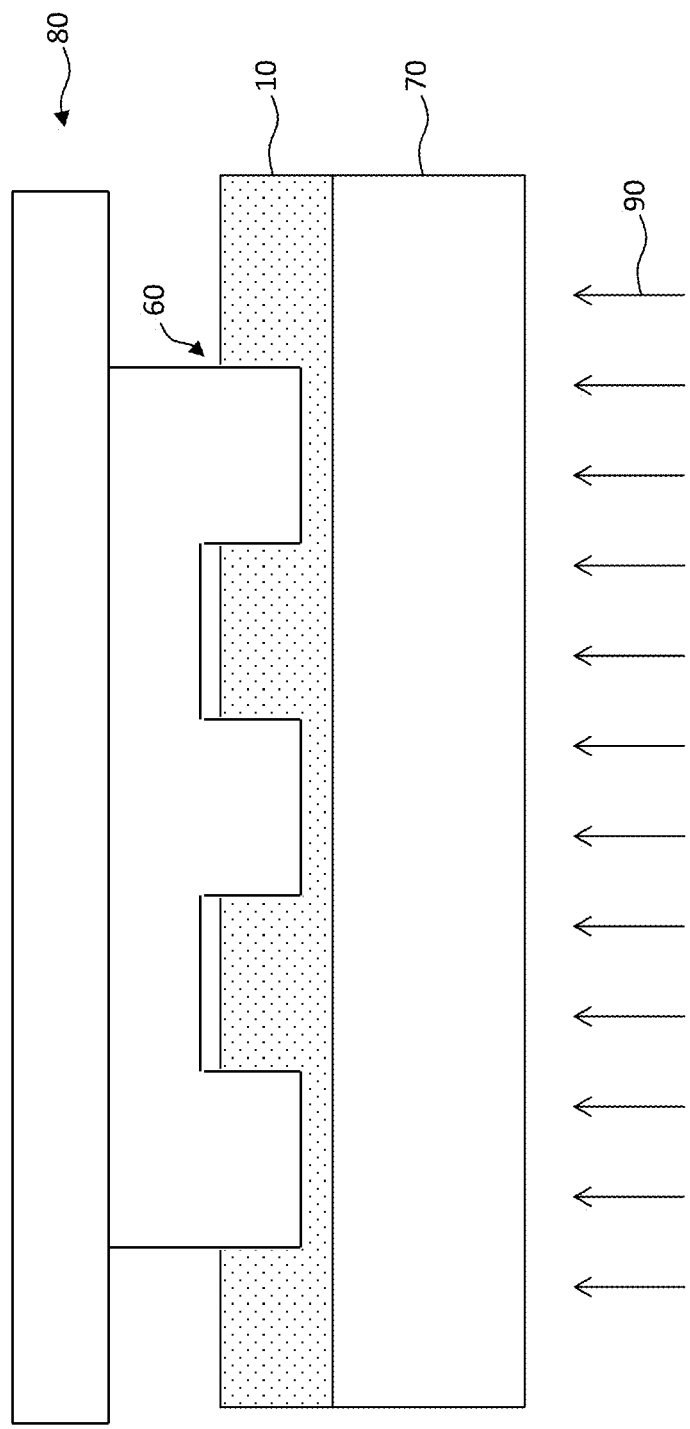
Figure 3F:
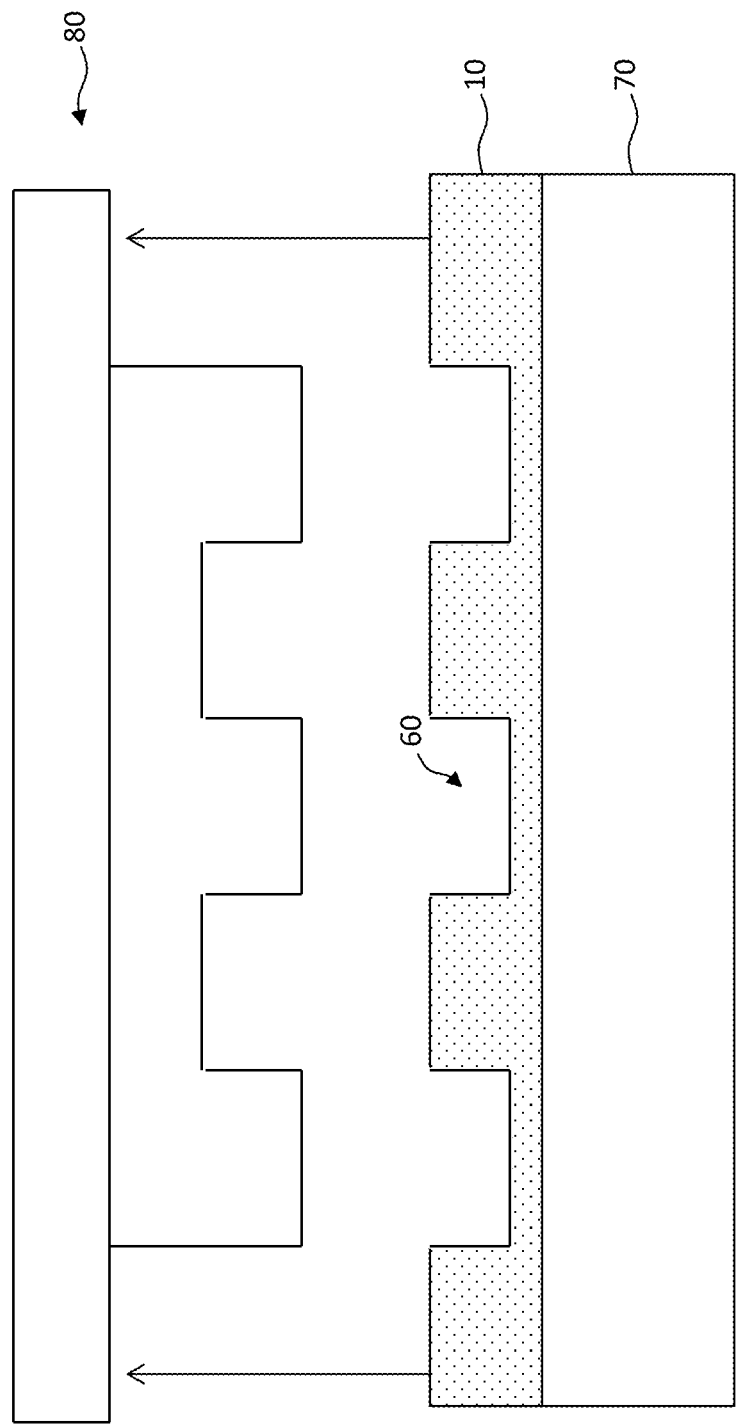

FIG. 2 illustrates an embossing stamp 80. FIGS. 3A-3G and FIG. 5 illustrate steps in forming an embossed substrate 10 having separated micro-channels 60. Referring to FIG. 3A, base layer 70 is provided (step 100). Base layer 70 is coated (step 105), as shown in FIG. 3B, to form substrate 10 having substrate surface 12. The coating can include a curable material, for example a curable polymer material curable by heat or radiation. Embossing stamp 80 is located adjacent to substrate 10 on base layer 70 and moved toward substrate 10 (FIG. 3C) until embossing stamp 80 embosses substrate 10 on base layer 70 (FIG. 3D) to form micro-channels 60. The coating material forming substrate 10 having micro-channels 60 on base layer 70 formed by embossing stamp 80 is cured, for example with heat or radiation 90 (FIG. 3E) and embossing stamp 80 is removed (FIG. 3F) leaving micro-channels 60 formed (step 110) in substrate 10 on base layer 70 (FIG. 3G).

Figure 4A:
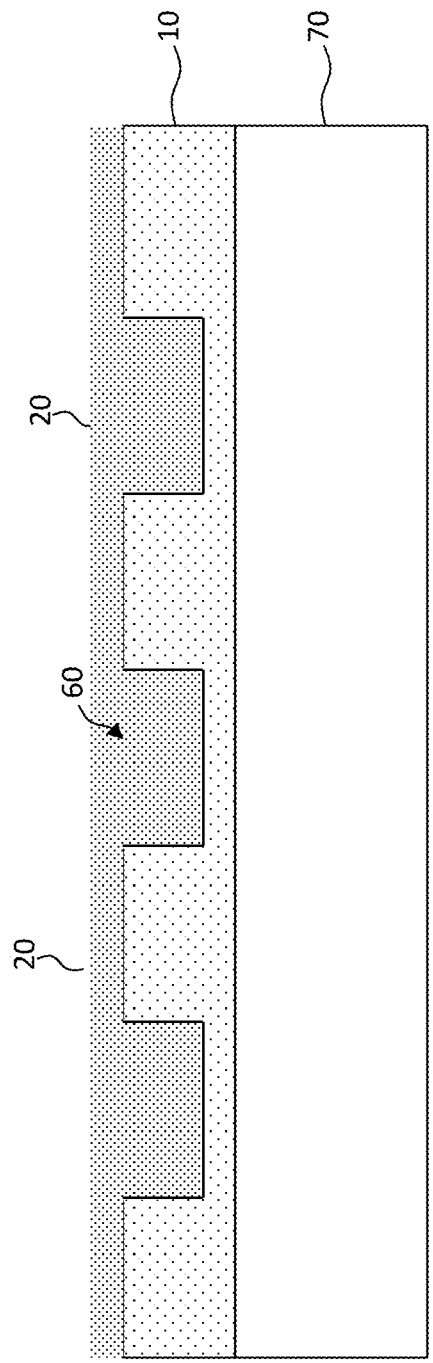
FIGS. 4A-4f are sequential cross sections illustrating steps in the construction of an embodiment of the present invention.
Figure 4B:
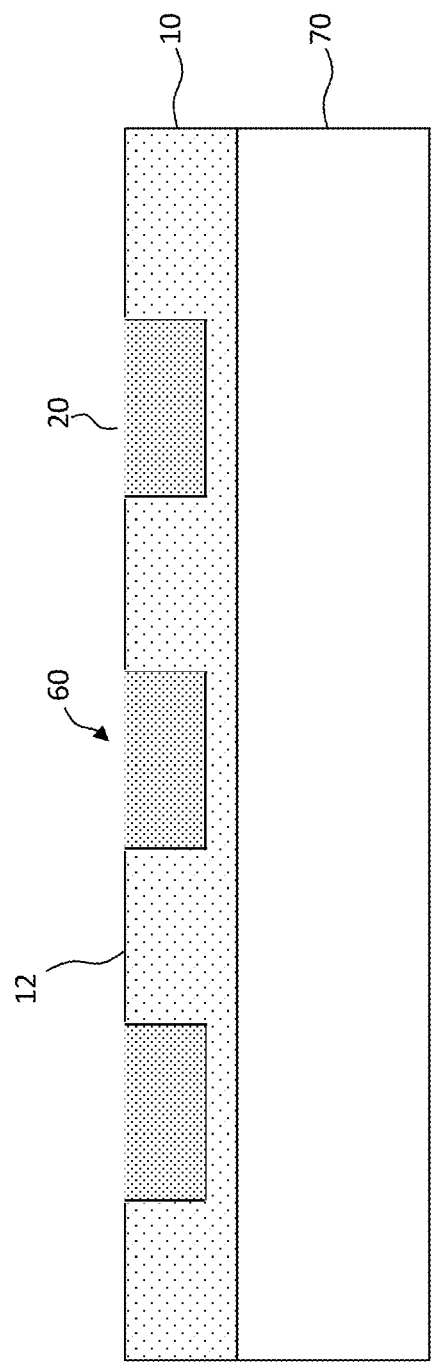

Referring next to FIG. 4A, a first material composition 20 is provided (step 115) and coated (step 120) over substrate 10 on base layer 70 and into micro-channels 60. In an embodiment, first material composition 20 is curable. First material composition 20 is removed (step 125) from substrate surface 12 of substrate 10 on base layer 70 (FIG. 4B) leaving some first material composition 20 in micro-channels 60, for example by mechanically wiping substrate surface 12 with a doctor blade or other tool.

Figure 4C:
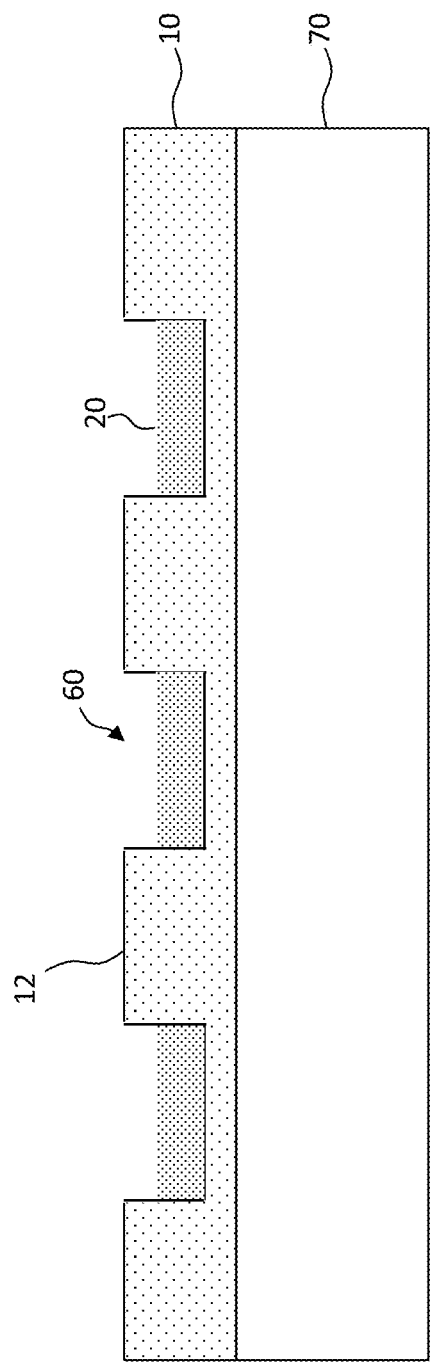

In an optional step 128 illustrated in FIG. 4C, first material composition 20 in micro-channel 60 in embossed substrate 10 on base layer 70 is dried. In an embodiment, drying is accomplished at room temperature without additional heating. In another embodiment, additional heat is used that does not cure first material composition 20 or does not completely cure first material composition 20. Drying first material composition 20 can reduce its size so that first material composition 20 only partially fills micro-channel 60. It has been demonstrated that drying (step 128) first material composition 20 does not cure first material composition 20 or render first material composition 20 electrically conductive. In particular, drying first material composition 20, where first material composition 20 includes metallic nano-particles, does not effectively sinter the particles to form an effective conductor.

Figure 4D:
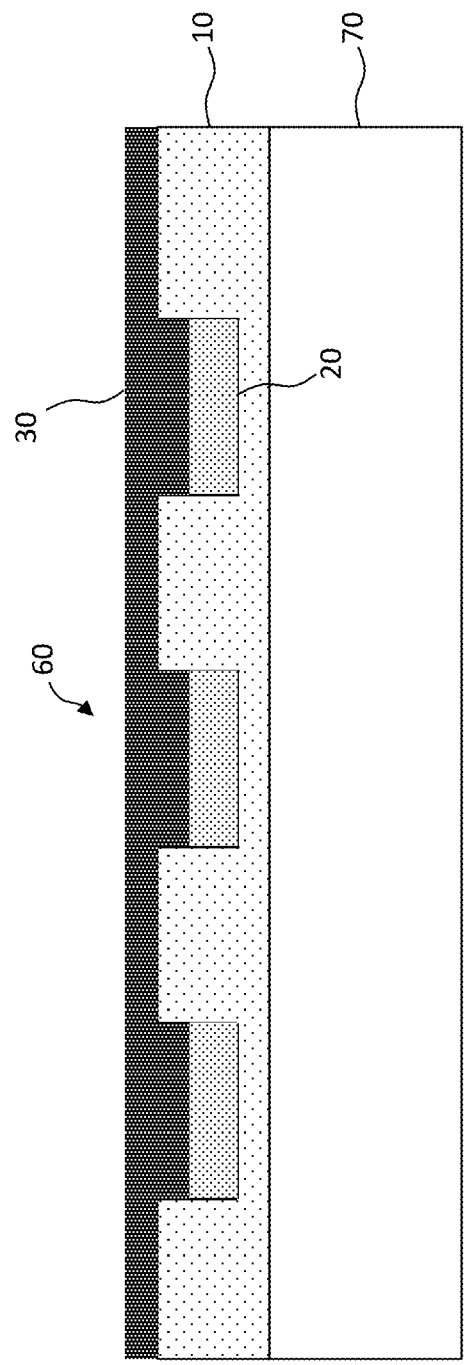

Referring to FIG. 4D, a second material composition 30 is provided (step 130) and coated (step 135) over substrate 10 on base layer 70 and into micro-channels 60 over first material composition 20. In an embodiment, second material composition 30 is curable. Second material composition 30 is removed (step 140) from substrate surface 12 of substrate 10 on base layer 70 (FIG. 4E) leaving some second material composition 30 in micro-channels 60 over first material composition 20.

Figure 4E:
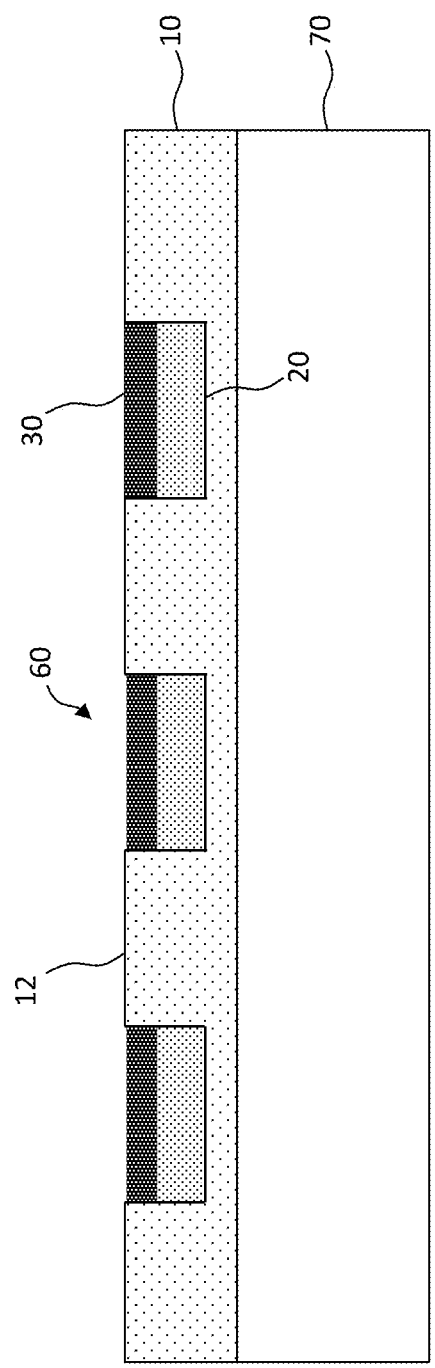
Figure 4F:
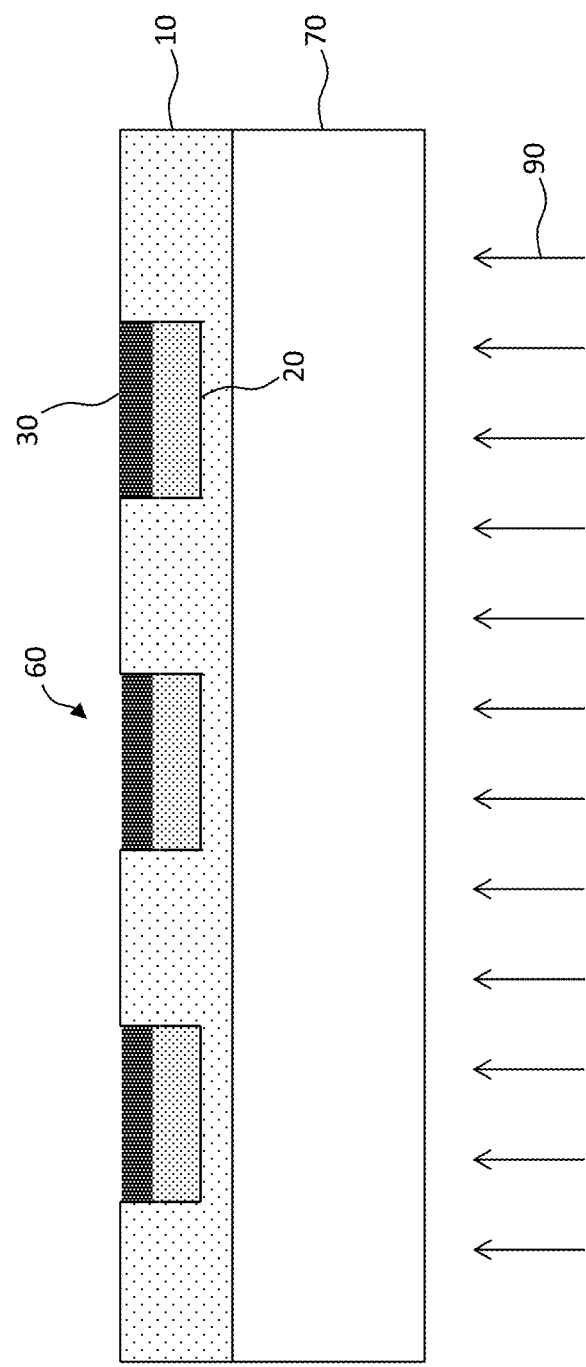
Figure 6:
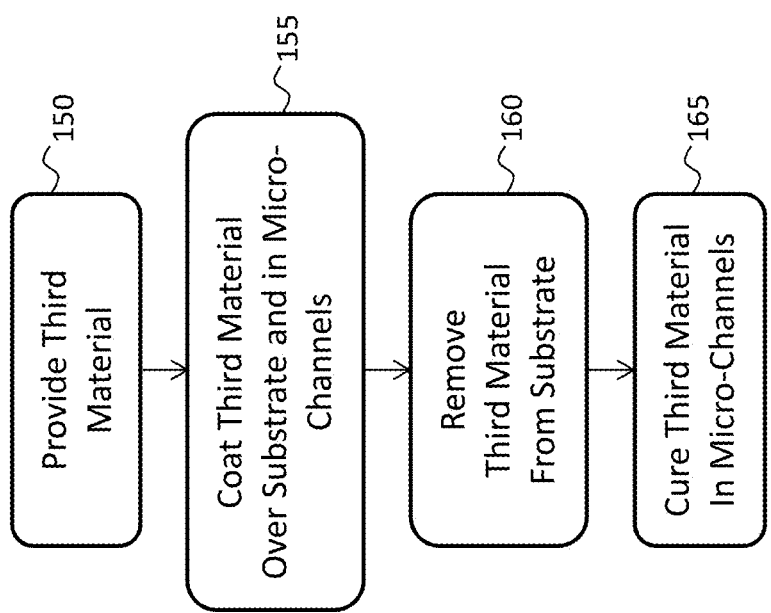

Referring to FIG. 4F, first and second material compositions 20, 30 in micro-channels 60 are cured (step 145) in micro-channels 60 in a common step to form cured first material layer 22 and cured second material layer 32 (FIG. 1), at least one of which is thereby rendered electrically conductive. Thus, cured first material layer 22 and cured second material layer 32 form electrically conductive multi-layer micro-wire 50 in each micro-channel 60.

In various embodiments, first material composition 20 and second material composition 30 are cured in a common step to form cured first material layer 22 and cured second material layer 32 by radiation, heat, or both. A common curing step reduces processing time in manufacturing and also reduces the likelihood of curing first or second material compositions 20, 30 on substrate surface 12 since substrate surface 12 is cleaned twice before common curing (step 145). If first or second material composition 20, 30 is cured on substrate surface 12, it disadvantageously reduces the transparency of the multi-layer micro-wire structure 5. Moreover, only a single curing step is performed, reducing the likelihood of inadvertently curing unwanted material composition on substrate surface 12. Hence, the present invention can improve the transparency of multi-layer micro-wire structure 5.

It has been demonstrated that the micro-channel-embossed substrate 10 can be coated with a material and excess material removed from substrate surface 12 with or without filling micro-channels 60. In an embodiment, removing first material composition 20 from substrate surface 12 also removes some first composition material 20 from micro-channels 60. Alternatively, first composition material 20 in micro-channels 60 is at least partially dried to reduce its size in micro-channels 60.

Figure 7A:
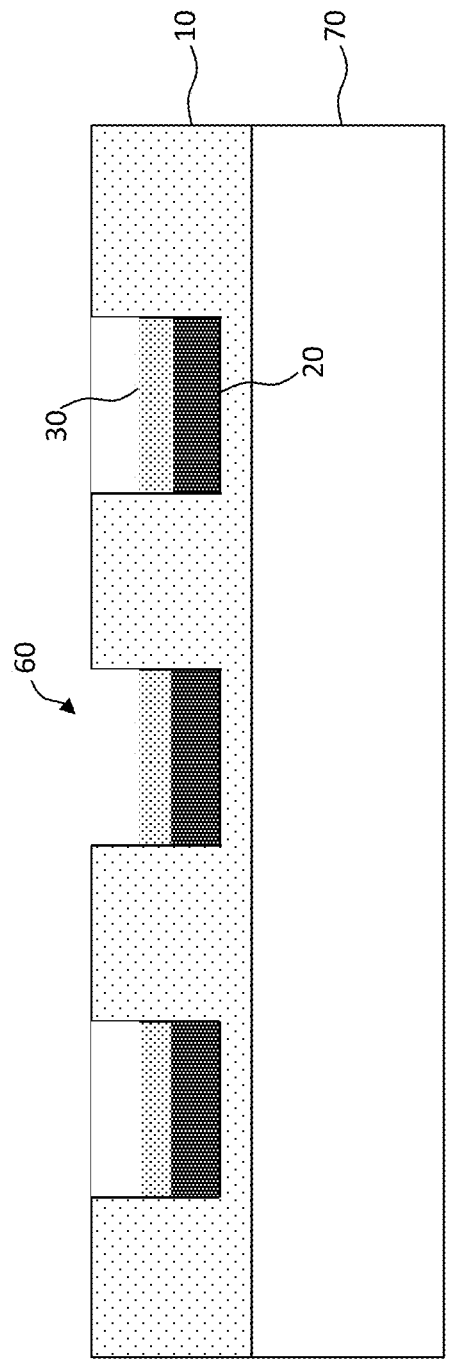
FIGS. 7A-7E are sequential cross sections illustrating steps in the construction of an alternative embodiment of the present invention.
Figure 7B:
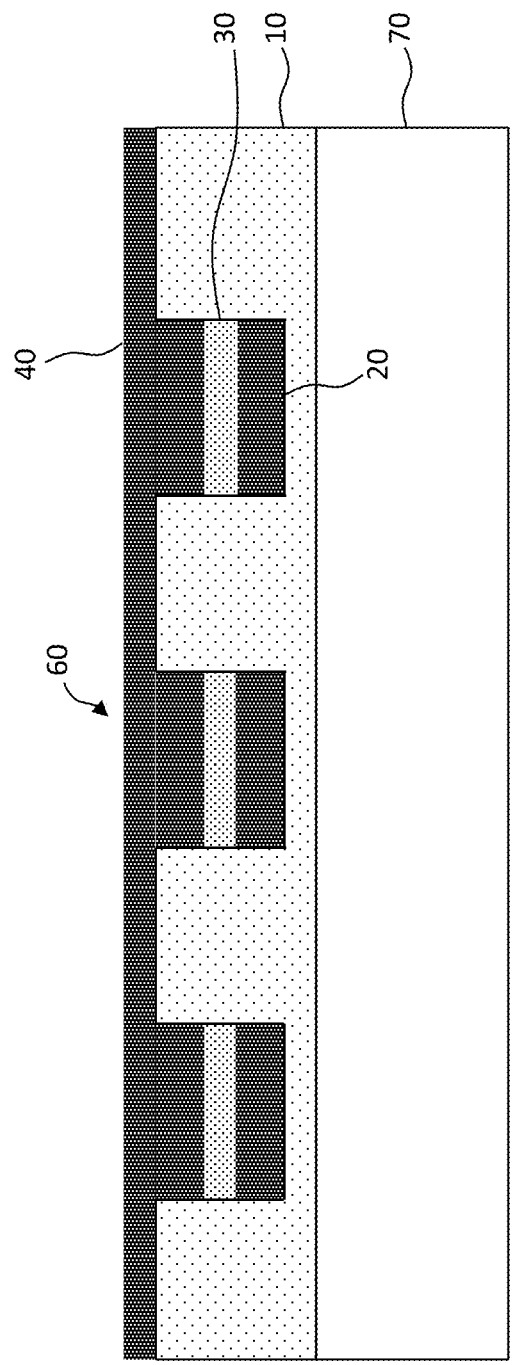
Figure 7C:
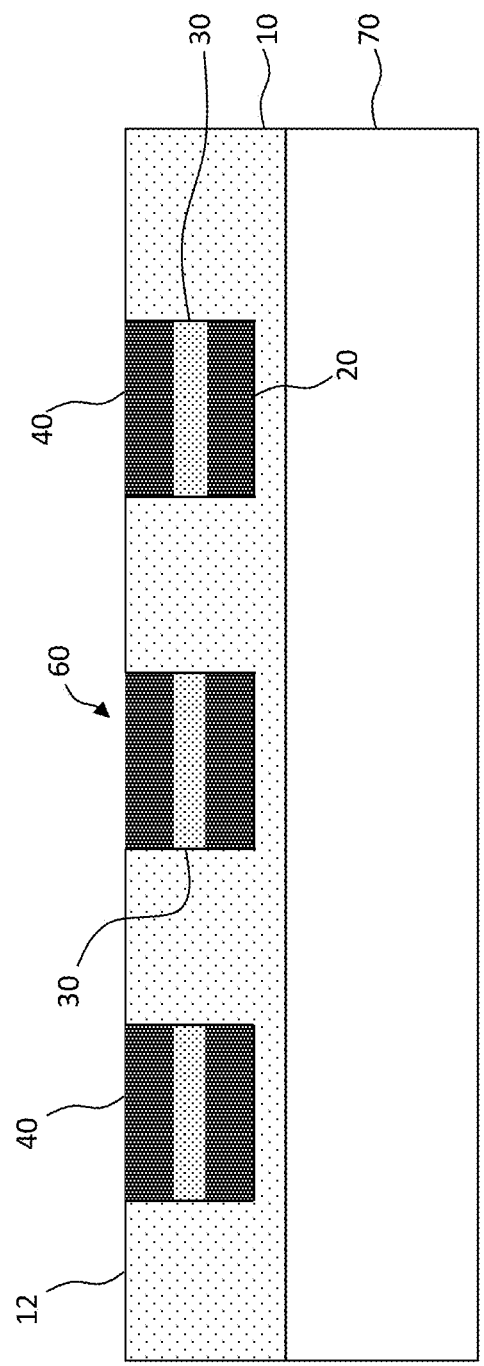
Figure 7D:
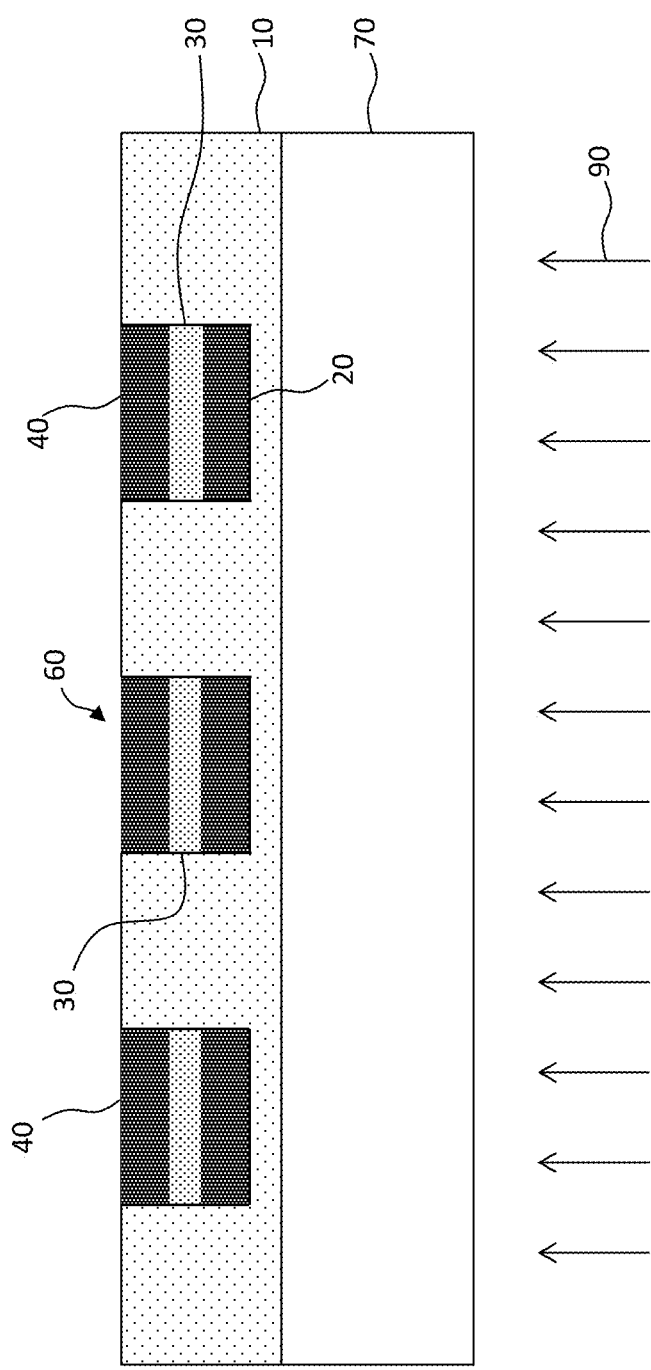
Figure 7E:
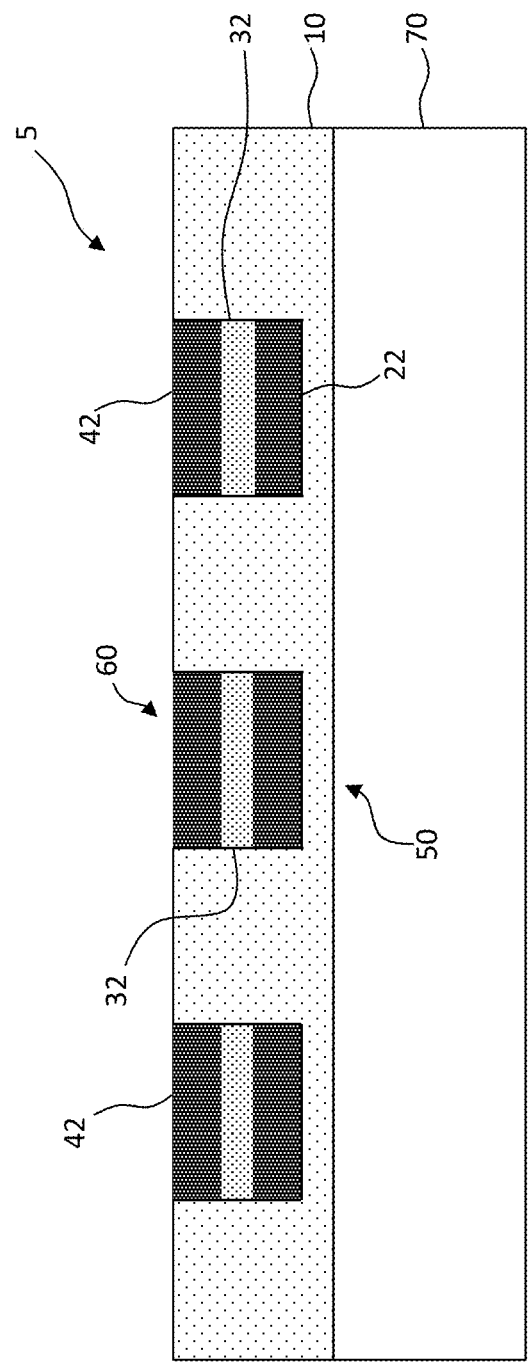

Referring to FIGS. 6 and 7A-7E, multi-layer micro-wires 50 of the present invention can have more than two layers, for example three layers. Referring to FIG. 7A, embossed substrate 10 is formed on base layer 70 with micro-channels 60 having first material composition 20 and second material composition 30 therein (corresponding to FIG. 4E). As shown in FIG. 7B, a third material composition 40 is provided (step 150) and coated (step 155) over substrate 10 on base layer 70, micro-channels 60, and first and second material compositions 20, 30. In an embodiment, third material composition 40 is curable. Third material composition 40 is removed (step 160) from substrate surface 12 of substrate 10 on base layer 70 (FIG. 7C) leaving some third material composition 40 in micro-channels 60 over first and second material compositions 20, 30. Third material composition 40 is then cured (step 165, FIG. 7D) in micro-channels 60 formed in substrate 10 on base layer 70, for example with heat or radiation 90, forming cured first, second, and third material layers 22, 32, 42 in micro-channels 60 in substrate 10 on base layer 70 of multi-layer micro-wire structure 5 (FIG. 7E).

Figures 8A, 8B:
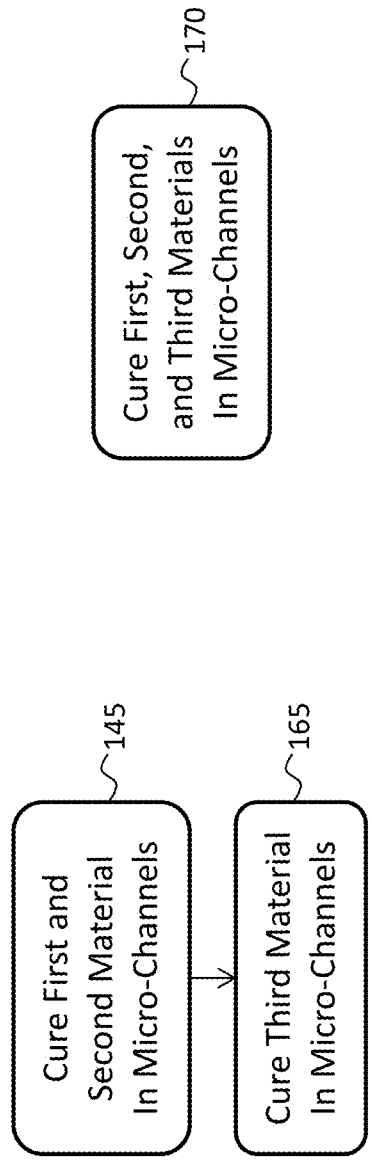
FIGS. 8A-8B are flow diagrams illustrating embodiments of the present invention.

In an embodiment, referring to FIG. 8A, first and second material compositions 20, 30 are cured in a common step 145 and third material composition 40 is cured in a subsequent step 165. Alternatively, referring to FIG. 8B, first, second, and third material compositions 20, 30, 40 are cured in a common step 170.

Figure 9:
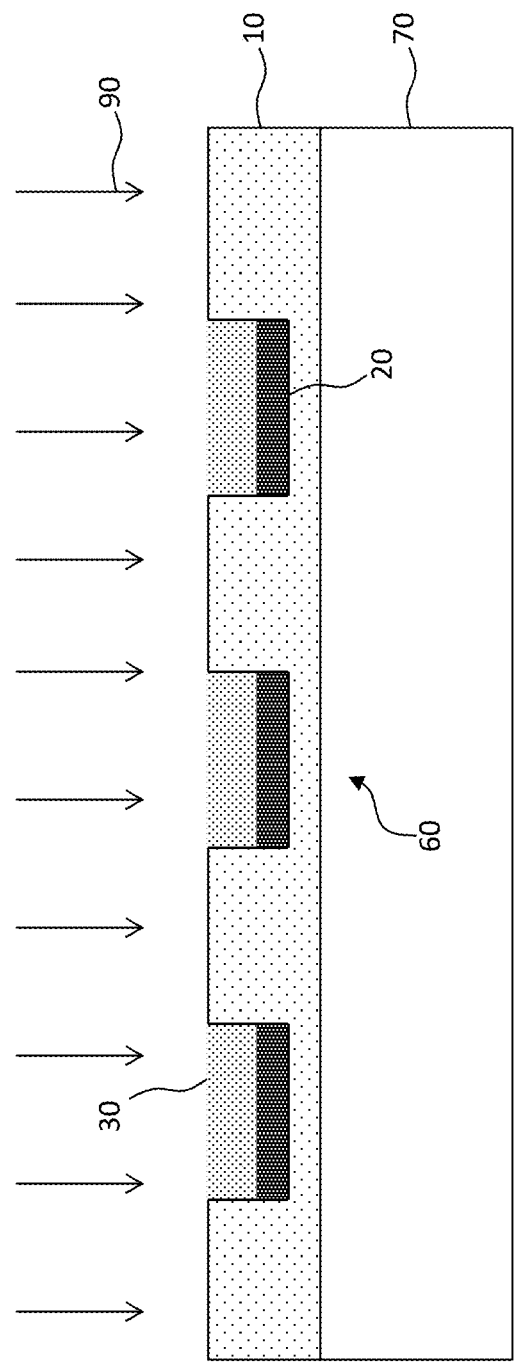
FIG. 9 is a cross section of an illustrating an alternative curing step for an embodiment of the present invention.

In an alternative curing step, referring to FIG. 9, heat or radiation 90 exposes first and second material compositions 20, 30 in micro-channels 60 in substrate 10 on base layer 70 without passing through base layer 70. In contrast, FIGS. 4E and 7D illustrate exposing first and second material compositions 20, 30 in micro-channels 60 in substrate 10 on base layer 70 after passing through base layer 70. In the case in which second material composition 30 is light-absorbing, radiation 90 can preferentially heat second material composition 30 with respect to substrate 10 and conductively heat first material composition 20, thereby curing first and second material compositions 20, 30 without necessarily heating substrate 10 to the same temperature. This increases the temperature at which first and second material compositions 20, 30 can be cured.

Third material composition 40 can be the same material as first material composition 20 or can have common components with first or second material composition 20, 30. Third material layer 42 can be more or less electrically conductive than first or second material layers 22, 32 or more or less light absorbing than first or second material layers 22, 32.

First, second, or third material compositions 20, 30, 40 can be provided (steps 115, 130, 150) as a liquid or as particles within a liquid carrier. Alternatively, first or second material compositions can be provided (steps 115, 130, 150) as a powder. First, second, or third material compositions 20, 30, 40 can be provided (115, 130, 150) together or before or after each other in separate process steps.

Figure 10A:
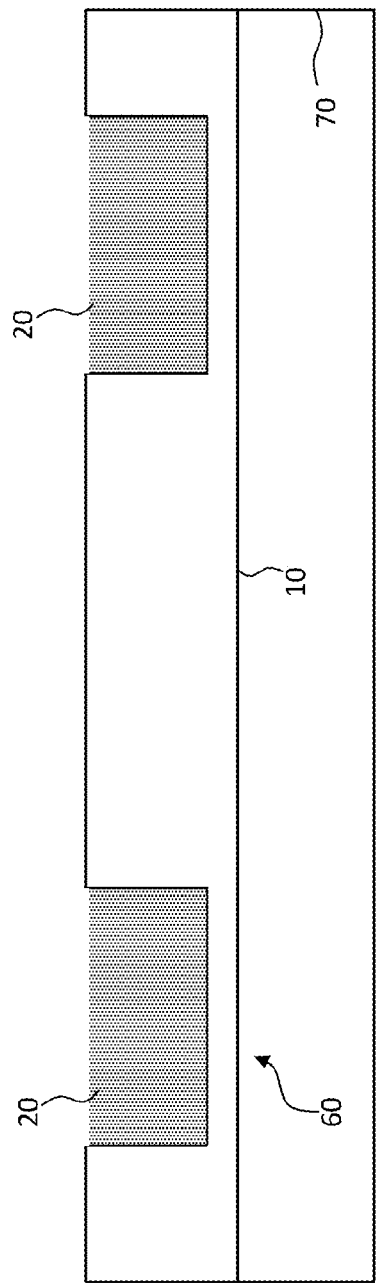
FIGS. 10A-10C are cross sections illustrating a method according to an embodiment of the present invention.
Figure 10B:
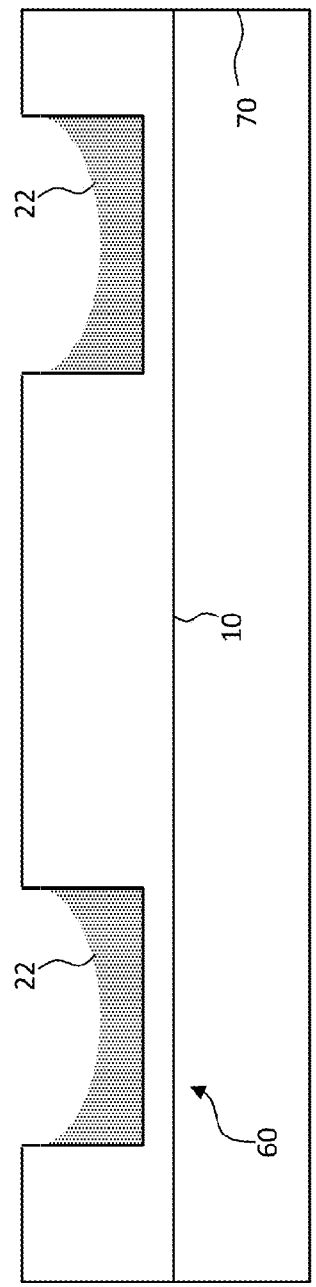
Figure 10C:
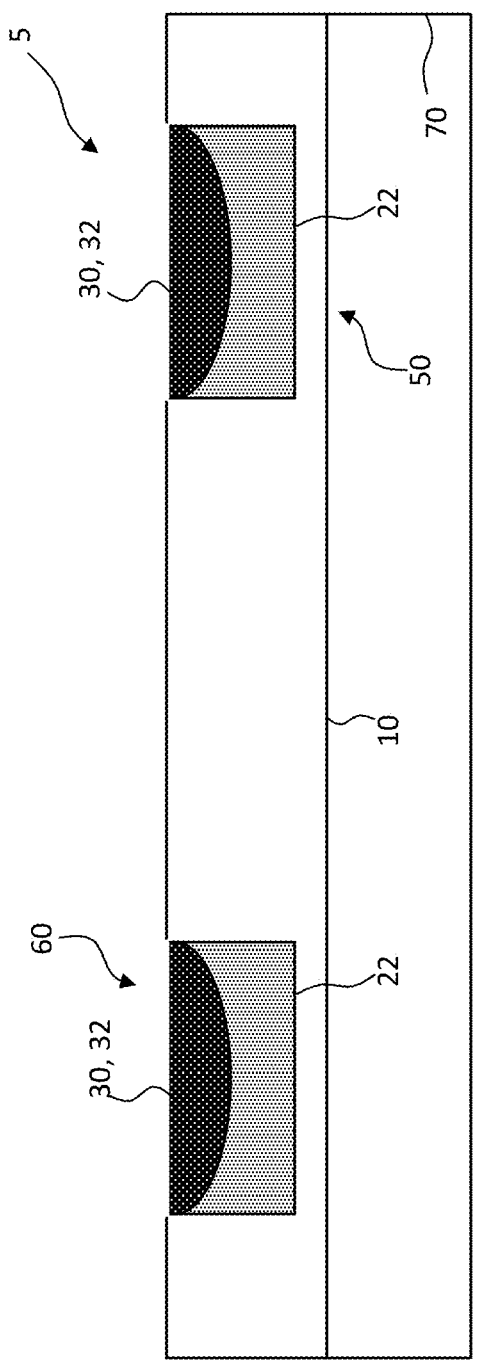

Referring to FIGS. 10A-10C, in an embodiment of the invention, base layer 70 with embossed substrate 10 includes micro-channels 60 that are filled with first material composition 20. First material composition 20 is dried to remove volatile inorganic or organic components or aqueous components of first material composition 20 forming a shrunken first material layer 22 (FIG. 10B). Referring to FIG. 10C, second material composition 30 are then coated. First and second material compositions 20, 30 are cured as described above to form second material layer 32 over first material layer 22 in embossed substrate 10 on base layer 70. Components (such as silver nano-particles) of first material layer 22 and second material layer 32 can be sintered to form a conductor as a result of the curing process so that first material layer 22 and second material layer 32 are adhered to each other.

Figure 11:
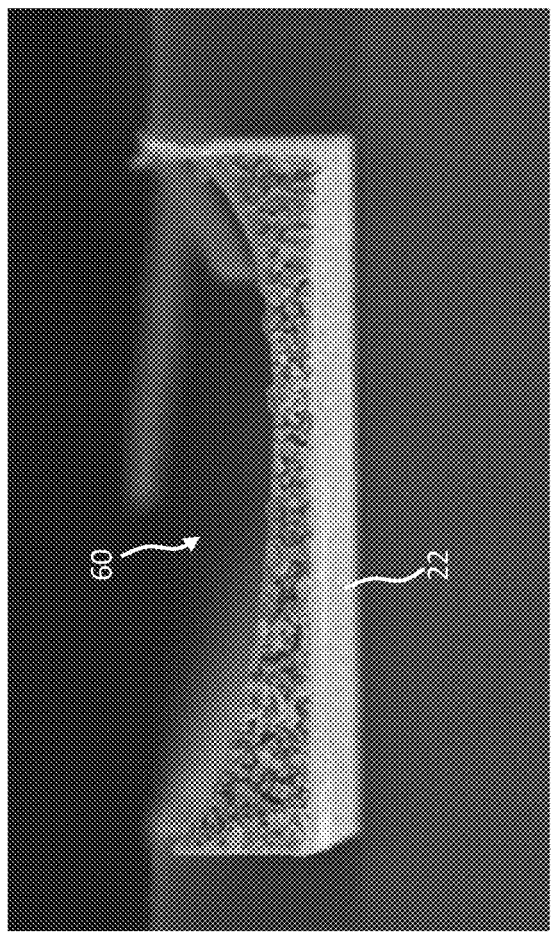
FIG. 11 is a micro-graphic image in cross section of a structure useful in an embodiment of the present invention.

FIG. 11 is a micrographic image of the structure of FIG. 10C wherein the first material layer 22 has a thickness of approximately one micron in the center of the micro-channel 60. FIG. 12 is a micrographic image of an alternative structure in which first material layer 22 in micro-channel 60 does not have a curved surface. First material layer 22 of FIG. 12 has an approximate thickness of 3 microns and micro-channel 60 has an approximate depth of 6 microns.

In a further method, the plurality of micro-channels 60 is formed (step 110) in substrate 10 by providing an impressionable layer as part of substrate 10. Substrates 10 can include multiple layers having different chemical or mechanical properties, for example a polymer layer (such as substrate 10) formed or located on a glass substrate (such as base layer 70) by coating or laminating a layer. Substrate 10 can be provided in one state and then processed into another state. In particular, substrate 10 can be initially provided as an uncured or a partially cured and impressionable polymer layer formed, for example by coating or laminating. The impressionable polymer layer is impressed with a pattern forming micro-channels 60, and then subsequently hardened for example by curing into a more rigid state. Curing can be accomplished by heating or electromagnetic radiation, for example exposure to ultra-violet light. Suitable curable materials are known in the art. Alternatively, substrate 10 can be provided as a glass or plastic layer in which micro-channels 60 are etched.

Material compositions can be cured by heating to form layers (first or second material layers 22, 32) or to adhere first or second material layers 22, 32 to each other or substrate 10. In particular, if micro-channel 60 is formed in a polymer layer, heating the polymer layer slightly can soften the polymer so that particles, for example black pigment or carbon black particles or conductive particles, in first or second material compositions 20, 30 can adhere to the polymer. Such heating can be done by convective heating (putting substrate 10 into an oven) or by infrared radiation. Heating with infrared radiation has the advantage that light-absorbing particles, for example black particles, differentially absorb the infrared radiation and heat up more than substrate 10 (that can be transparent), thus providing a more efficient adhesion or curing process for a material composition. Adhesion of first or second material layers 22, 32 to substrate 10 or to each other is advantageous because such adhered layers are more resistant to mechanical abrasion and are thus more environmentally robust.

First, second, or third material compositions 20, 30, 40 can be provided in one state and then processed into another state, for example converted from a liquid state into a solid state, to form a material layer. Such conversion can be accomplished in a variety of ways, for example by drying or heating, exposure to gases, or exposure to radiation. Furthermore, first, second, or third material compositions 20, 30, 40 can include a set of materials that are processed to remove solvents from the material composition.

For example, a material composition including a solvent is deposited and then processed to remove the solvent leaving a material composition without the solvent in place. Thus, according to embodiments of the present invention, first, second, or third material compositions 20, 30, 40 that is located in micro-channel 60 on substrate 10 is not necessarily the same composition as that found in a cured material layer (first, second or third material layer 22, 32, 42).

In an embodiment, first material composition 20 is immiscible with second material composition 32, is more viscous than second material composition 32, or has a higher specific gravity than second material composition 32. Such differences in material properties can discourage the materials of first material composition 20 from mixing with the materials of second material composition 30, thereby causing first material layer 22 to have different properties from second material layer 32, for example different electrical conductivity or light absorption properties.

In yet another embodiment, first material composition 20 is partially cured before coating the second material composition 30 and before the common curing step 145. A partial cure of first material composition 20 can likewise discourage the materials of first material composition 20 from mixing with the materials of second material composition 30 as well as reduce the size of the first material composition 20.

In various embodiments, first, second, or third material compositions 20, 30, 40 or first, second, or third material layers 22, 32, 42 can include conductive particles such as metal nano-particles. The metal nano-particles can be sintered to form a metallic electrical conductor, such as multi-layer micro-wires 50. The metal can be silver or a silver alloy or other metals, such as tin, tantalum, titanium, gold, or aluminum, or alloys thereof. First, second, or third material compositions 20, 30, 40 or first, second, or third material layers 22, 32, 42 can include light-absorbing materials such as carbon black, a dye, or a pigment. In one embodiment, second material layer 32 includes carbon black, a black dye, or a black pigment and first material layer 22 includes silver nano-particles. In another embodiment, second material layer 32 includes carbon black, a black dye, or a black pigment and first and second material layers 22, 32 both include silver nano-particles. In yet another embodiment, first and second material layers 22, 32 include the same materials in different ratios.

Multi-layer micro-wire 50 including first and second material layers 22, 32 formed in micro-channels 60 in substrate 10 can have a width less than a depth or thickness so that multi-layer micro-wire 50 has an aspect ratio (depth/width) greater than one. Multi-layer micro-wire 50 can be covered with a protective layer to protect from scratches or other environmental damage, including mechanical or chemical damage. The protective layer can be formed over just multi-layer micro-wire 50 (not shown) or over a more extensive portion of substrate surface 12 (not shown).

Second material layer 32 need not continuously cover first material layer 22 in multi-layer micro-wire 50. In an embodiment, second material layer 32 completely covers first material layer 22 (as shown in FIG. 1). Alternatively, second material layer 32 covers first only a portion of first material layer 22 (not shown).

In various embodiments of the present invention, multi-layer micro-wire 50 has a width less than or equal to 10 microns, 5 microns, 4 microns, 3 microns, 2 microns, or 1 micron. Likewise, micro-channel 60 has a width less than or equal to 20 microns, 10 microns, 5 microns, 4 microns, 3 microns, 2 microns, or 1 micron. In some embodiment, multi-layer micro-wire 50 can fill micro-channel 60; in other embodiments multi-layer micro-wire 50 does not fill micro-channel 60.

In an embodiment, first or second material layer 22, 32 is solid. In another embodiment, first or second material layer 22, 32 is porous. First or second material composition 20, 30 can include conductive particles or light-absorbing particles in a liquid carrier (for example an aqueous solution). The liquid carrier can be located in micro-channels 60 (such as by dip coating or curtain coating) and heated or dried to remove the liquid carrier, leaving a porous assemblage of conductive particles that can be sintered to form a porous electrical conductor in a layer.

In an embodiment, first and second material compositions 20, 30 are processed to change the material compositions of first and second material layers 22, 32, for example by drying or treatment with hydrochloric acid, to remove liquid carriers, agglomerate conductive particles, or move light-absorbing particles outside the area of agglomerated conductive particles.

Conductive particles can be, for example, silver nano-particles and light-absorbing particles can be, for example, carbon black, a dye, or pigments. The liquid carrier can be an aqueous solution and can include surfactants, humectants, thickeners, adhesives and other active chemicals. Using a commercial dye and silver nano-particles, first or second material compositions 20, 30 have been processed with HCl and heated to form a cured layer structure.

Although, for clarity, first and material second layers 22, 32 are illustrated as distinct layers, in practice first and second material layers 22, 32 can overlap or intermingle somewhat, and such material layers are included in the present invention.

Conductive ink formulations useful for the present invention are commercially available, as are substrates, substrate coating methods, and micro-patterning methods for forming micro-channels. Curable polymer layers are well known as are method for coating, patterning, and curing them. Light-absorbing materials are also known and can be made into coatable material compositions using techniques known in the chemical arts.

For example, it has been demonstrated that multi-layer micro-wires 50 can be made in substrate surface 12 embossed with micro-channels 60 by coating substrate 10 with a conductive ink including dyes or immersing substrate 10 in a bath of conductive ink including dyes, removing excess material not in micro-channels 60, and then processing substrate 10 and conductive ink in micro-channels 60 with HCl and heat.

Multi-layer micro-wire structures 5 and methods of the present invention are useful for making electrical conductors and busses for transparent micro-wire electrodes and electrical conductors in general, for example as used in busses. A variety of micro-wire patterns can be used and the present invention is not limited to any one pattern. Multi-layer micro-wires 50 can be spaced apart, form separate electrical conductors, or intersect to form a mesh electrical conductor in substrate 10. Micro-channels 60 can be identical or have different sizes, aspect ratios, or shapes. Similarly, multi-layer micro-wires 50 can be identical or have different sizes, aspect ratios, or shapes. Multi-layer micro-wires 50 can be straight or curved.

Substrate 10 or base layer 70 can be a rigid or a flexible substrate made of, for example, a glass or polymer material, can be transparent, and can have opposing substantially parallel and extensive surfaces. Substrate 10 or base layer 70 can include a dielectric material useful for capacitive touch screens and can have a wide variety of thicknesses, for example 10 microns, 50 microns, 100 microns, 1 mm, or more. In various embodiments of the present invention, substrates 10 are provided as a separate structure or are coated on another base layer 70, for example by coating a polymer substrate layer on an underlying glass substrate. Such substrates 10 and base layers 70 and their methods of construction are known in the prior art.

Substrate 10 or base layer 70 can be an element of other devices, for example the cover or substrate of a display or a substrate, cover, or dielectric layer of a touch screen. According to embodiments of the present invention, multi-layer micro-wires 50 extend across at least a portion of substrate 10 in a direction parallel to substrate surface 12.

Multi-layer micro-wire structures 5 of the present invention are useful, for example in touch screens such as projected-capacitive touch screens that use transparent micro-wire electrodes and in displays. Multi-layer micro-wire structures 5 can be located in areas other than display areas, for example in the perimeter of the display area of a touch screen, where the display area is the area through which a user views a display.

When used in display systems, micro-layer micro-wires 50 of the present invention provide an advantage in that light-absorbing layers can reduce reflection from substrate surface 12, thereby improving the contrast of a display system. At the same time, the conductive layers provide electrical conduction useful for transmitting electrical signals or forming electrical fields. Multi-layer micro-wires 50 operate to conduct electricity or form an electrical field along the length of multi-layer micro-wire 50.

Conductive inks including metallic particles are known in the art. In useful embodiments, the conductive inks include nano-particles, for example silver, in a carrier fluid such as an aqueous solution. The carrier fluid can include surfactants that reduce flocculation of the metal particles. Once deposited, the conductive inks are cured, for example by heating. The curing process drives out the solution and sinters the metal particles to form a metallic electrical conductor. In other embodiments, the conductive inks are powders that are pattern-wise transferred to a substrate and cured or are powders coated on a substrate and pattern-wise cured. Conductive inks are known in the art and are commercially available.

In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed. The conductive ink is not necessarily conductive at any other point in multi-layer micro-wire 50 formation process.

Substrate 10 or base layer 70 of the present invention can include any material capable of providing a supporting surface on which multi-layer micro-wires 50 can be formed and patterned. Substrates such as glass, metal, or plastic can be used and are known in the art together with methods for providing suitable surfaces. In a useful embodiment, substrate 10 or base layer 70 is substantially transparent, for example having a transparency of greater than 90%, 80%, 70% or 50% in the visible range of electromagnetic radiation.

A conductive layer of multi-layer micro-wires 50 can be metal, for example silver, gold, aluminum, nickel, tungsten, titanium, tin, or copper or various metal alloys including, for example silver, gold, aluminum, nickel, tungsten, titanium, tin, or copper. Multi-layer micro-wires 50 can include a thin metal layer composed of highly conductive metals such as gold, silver, copper, or aluminum. Other conductive metals or materials can be used. Alternatively, multi-layer micro-wires 50 can include cured or sintered metal particles such as nickel, tungsten, silver, gold, titanium, or tin or alloys such as nickel, tungsten, silver, gold, titanium, or tin. Conductive inks can be used to form multi-layer micro-wires 50 with pattern-wise deposition or pattern-wise formation followed by curing steps. Other materials or methods for forming multi-layer micro-wires 50 can be employed and are included in the present invention.

In an example and non-limiting embodiment of the present invention, each multi-layer micro-wire 50 is from 5 microns wide to one micron wide and is separated from neighboring multi-layer micro-wires 50 by a distance of 20 microns or less, for example 10 microns, 5 microns, 2 microns, or one micron.

Methods and device for forming and providing substrates, coating substrates, patterning coated substrates, or patternwise depositing materials on a substrate are known in the photo-lithographic arts. Likewise, tools for laying out electrodes, conductive traces, and connectors are known in the electronics industry as are methods for manufacturing such electronic system elements. Hardware controllers for controlling electrodes, touch screens, and displays and software for managing electrodes, displays, and touch screen systems are all well known. All of these tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

5 multi-layer micro-wire structure
10 substrate
12 substrate surface
20 first material composition
22 first material layer
30 second material composition
32 second material layer
40 third material composition
42 third material layer
50 multi-layer micro-wire
60 micro-channel
70 base layer
80 embossing stamp
90 radiation/heat
100 provide base layer step
105 coat substrate step
110 form micro-channels step
115 provide first material step
120 coat first material over substrate and in micro-channels step
125 remove first material from substrate step
128 optional dry first material step
130 provide second material step
135 coat second material over substrate and in micro-channels over first material step
140 remove second material from substrate step
145 cure first and second material in micro-channels step
150 provide second material step
155 coat third over substrate and in micro-channels step
160 remove third material from substrate step
165 cure third material in micro-channels step
170 cure first, second, and third materials in micro-channels step

The invention claimed is:

1. A method of making a multi-layer micro-wire structure, comprising:
   providing a substrate having a surface;
   forming a plurality of micro-channels in the substrate;
   providing a first material composition and providing a second material composition different from the first material composition, wherein the first material composition is electrically conductive and the second material composition is electrically conductive;
   coating the first material composition over the substrate surface and in the micro-channels;
   removing the first material composition from the substrate surface leaving some first material composition in the micro-channels;
   coating the second material composition different from the first material over the substrate surface, in the micro-channels, and over the first material composition in the micro-channels;
   removing the second material composition from the substrate surface leaving some second material composition in the micro-channels;
   curing the first and second material compositions in the micro-channels in a common step to form a cured first material layer and a cured second material layer in the micro-channels; and
   wherein the cured first material layer and the cured second material layer form an electrically conductive multi-layer micro-wire in each micro-channel, and wherein the cured first material layer is more electrically conductive when cured than the cured second material layer and the cured second material layer is more light absorbing when cured than the cured first material layer.

2. The method of claim 1, wherein the first and second material compositions include common materials or first and second material layers include common materials.

3. The method of claim 2, wherein the first and second material compositions include conductive particles or the first and second material layers include conductive particles.

4. The method of claim 1, wherein curing the first and second material compositions includes heating or drying the first and second material compositions or sintering or welding conductive particles in the first and second material compositions together.

5. The method of claim 1, wherein the cured first material layer is adhered to the cured second material layer.

6. The method of claim 1, wherein either the cured first material layer or the cured second material layer is light absorbing.

7. The method of claim 1, further including:
   providing a third material composition;
   coating the third material composition over the substrate surface and micro-channels;
   removing the third material composition from the substrate surface leaving some third material composition in the micro-channels;
   curing the third material compositions in the micro-channels to form a cured third material layer; and
   wherein the cured first material layer, the cured second material layer, and the cured third material layer form an electrically conductive multi-layer micro-wire in each micro-channel.

8. The method of claim 7, further including curing the first, second, and third material compositions in a common step.

9. The method of claim 1, further including adhering the cured first material layer to the cured second material layer.

10. The method of claim 1, wherein the first material composition is immiscible with the second material composition, is more viscous than the second material composition, or has a higher specific gravity than the second material composition.

11. The method of claim 1, further including at least partly drying the first material composition before the second material composition is coated.

12. The method of claim 1, further including at least partly but not completely curing the first material composition before the common curing step.

13. The method of claim 1, wherein removing first material composition from the substrate surface includes removing some but not all of the first material composition from the micro-channels.

14. The method of claim 1, further including curing the first and second material compositions at least partially by radiation.

15. A method of making a multi-layer micro-wire structure, comprising:
- providing a substrate having a surface;
- forming a plurality of micro-channels in the substrate;
- providing a first electrically conductive material composition;
- providing a second electrically conductive material composition that is different from the first material composition;
- coating the first electrically conductive material composition over the substrate surface and in the micro-channels;
- removing the first electrically conductive material composition from the substrate surface leaving some of the first electrically conductive material composition in the micro-channels;
- coating the second electrically conductive material composition over the substrate surface, in the micro-channels, and over the first electrically conductive material composition in the micro-channels;
- removing the second electrically conductive material composition from the substrate surface leaving some of the second electrically conductive material composition in the micro-channels; and
- curing the first and second electrically conductive material compositions in the micro-channels to form a cured first material layer and a cured second material layer in the micro-channels, wherein the cured first material layer and the cured second material layer form an electrically conductive multi-layer micro-wire in each micro-channel, and wherein the cured first material layer is more electrically conductive than the cured second material layer and the cured second material layer is more light absorbing than the cured first material layer.

* * * * *